(12) United States Patent
Hoentschel et al.

(10) Patent No.: US 9,472,642 B2
(45) Date of Patent: Oct. 18, 2016

(54) METHOD OF FORMING A SEMICONDUCTOR DEVICE STRUCTURE AND SUCH A SEMICONDUCTOR DEVICE STRUCTURE

(71) Applicant: GLOBALFOUNDRIES Inc., Grand Cayman (KY)

(72) Inventors: Jan Hoentschel, Dresden (DE); Stefan Flachowsky, Dresden (DE); Ralf Richter, Radebeul (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/693,978

(22) Filed: Apr. 23, 2015

(65) Prior Publication Data

US 2016/0163815 A1 Jun. 9, 2016

Related U.S. Application Data

(60) Provisional application No. 62/089,406, filed on Dec. 9, 2014.

(51) Int. Cl.
| | |
|---|---|
| *H01L 21/336* | (2006.01) |
| *H01L 29/66* | (2006.01) |
| *H01L 21/283* | (2006.01) |
| *H01L 29/78* | (2006.01) |
| *H01L 29/06* | (2006.01) |
| *H01L 29/45* | (2006.01) |

(52) U.S. Cl.
CPC ......... *H01L 29/665* (2013.01); *H01L 21/283* (2013.01); *H01L 29/0653* (2013.01); *H01L 29/45* (2013.01); *H01L 29/6653* (2013.01); *H01L 29/6656* (2013.01); *H01L 29/7848* (2013.01)

(58) Field of Classification Search
CPC ............ H01L 29/665; H01L 21/283; H01L 29/7848; H01L 29/0653; H01L 29/6653; H01L 29/6656
USPC ........................................................ 438/300
See application file for complete search history.

(56) References Cited

U.S. PATENT DOCUMENTS

| | | | | |
|---|---|---|---|---|
| 7,495,280 B2 * | 2/2009 | Lo | ................ | H01L 29/4983 257/314 |
| 7,767,534 B2 * | 8/2010 | Yang | ................ | H01L 29/7847 257/288 |
| 8,048,752 B2 * | 11/2011 | Wu | ................ | H01L 21/823468 257/E21.626 |
| 8,455,952 B2 * | 6/2013 | Lin | ................ | H01L 21/823418 257/288 |
| 8,536,660 B2 * | 9/2013 | Hsu | ................ | 257/410 |

* cited by examiner

*Primary Examiner* — Luan C Thai
(74) *Attorney, Agent, or Firm* — Amerson Law Firm, PLLC

(57) ABSTRACT

The present disclosure provides in one aspect for a semiconductor device structure which may be formed by providing source/drain regions within a semiconductor substrate in alignment with a gate structure formed over the semiconductor substrate, wherein the gate structure has a gate electrode structure, a first sidewall spacer and a second sidewall spacer, the first sidewall spacer covering sidewall surfaces of the gate electrode structure and the sidewall spacer being formed on the first sidewall spacer. Furthermore, forming the semiconductor device structure may include removing the second sidewall spacer so as to expose the first sidewall spacer, forming a third sidewall spacer on a portion of the first sidewall spacer such that the first sidewall spacer is partially exposed, and forming silicide regions in alignment with the third sidewall spacer in the source/drain regions.

25 Claims, 11 Drawing Sheets

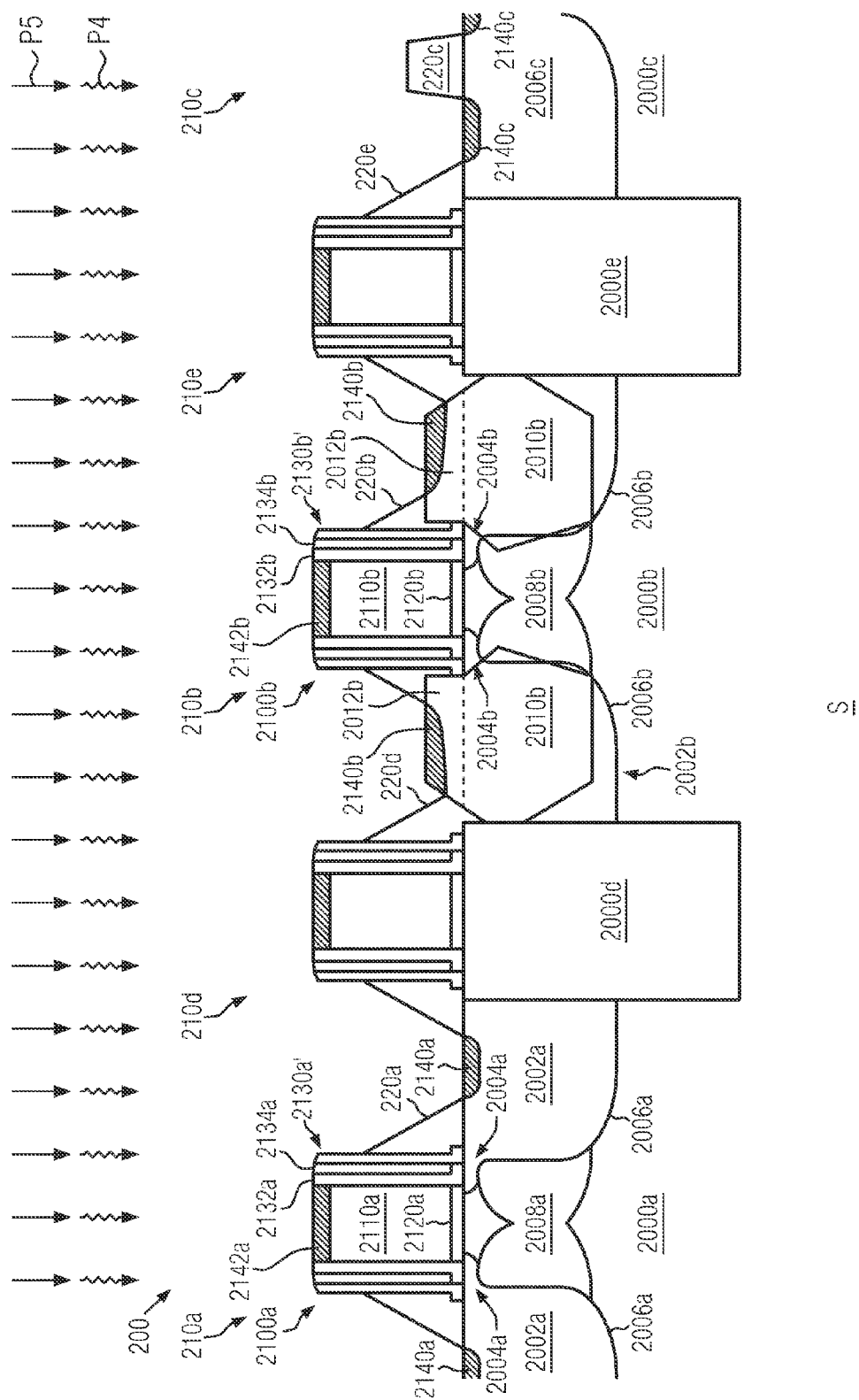

METHOD OF FORMING A SEMICONDUCTOR DEVICE STRUCTURE AND SUCH A SEMICONDUCTOR DEVICE STRUCTURE

BACKGROUND OF THE INVENTION

1. Field of the Invention

The present disclosure relates to a method of forming a semiconductor device structure and to such a semiconductor device structure. Particularly, the present disclosure relates to processes at the end of front-end-of-line (FEOL) fabrication, particularly at contact formation and silicidation stages.

2. Description of the Related Art

In modern electronic equipment, integrated circuits (ICs) experience a vast applicability in a continuously spreading range of applications. In particular, the demand for increasing mobility of electronic devices at high performance and low energy consumption drives developments to more and more compact devices having features with sizes significantly smaller than 1 µm, the more so as current semiconductor technologies are apt of producing structures with dimensions in the magnitude of 100 nm or less. With ICs representing a set of electronic circuit elements integrated on the semiconductor material, normally silicon, ICs can be made much smaller than any discreet circuit composed of separate independent circuit components. Indeed, the majority of present-day ICs are implemented by using a plurality of circuit elements, such as field effect transistors (FETs), also called metal oxide semiconductor field effect transistors (MOSFETs) or simply MOS transistors, and passive elements, such as resistors, e.g., diffusion resistors, in capacitors, integrated on a semiconductor substrate with a given surface area, wherein typical present-day ICs involve millions of single circuit elements formed on a semiconductor substrate.

The basic function of a FET is that of an electronic switching element, controlling a current through a channel region between two junction regions, referred to as source and drain, by a gate electrode which is disposed over the channel region and to which a voltage relative to source and drain is applied. In common FETs, the channel region extends along the plane between the source and drain regions. Generally, in applying a voltage exceeding a characteristic voltage level to the gate electrode, the conductivity state of the channel is changed and switching between a conducting state or "ON state" and a non-conducting state or "OFF state" may be achieved. It is important to note that the characteristic voltage level at which the conductivity state changes (usually called the "threshold voltage") therefore characterizes the switching behavior of the FET and it is an issue to keep variations in the threshold voltage level low for implementing a well-defined switching characteristic. However, with the threshold voltage depending nontrivially on the transistor properties, e.g., materials, dimensions, etc., the implementation of a desired threshold voltage value during fabrication processes involves careful adjustment and fine-tuning during the fabrication process, which makes the fabrication of advanced semiconductor devices increasingly complex.

With the sizes of individual FETs having steadily decreased over the last decades, it was observed that strongly-scaled FETs more and more suffered from undesirable effects once the channel length of a FET entered the same order of magnitude as the width of the depletion layer of the source/drain regions. For strongly-scaled FETs, for example, the OFF state leakage current (i.e., the leakage current during the OFF state) increased with the idle power required by the device. Accordingly, these deteriorating effects appearing at small scales and being associated with short channel lengths are frequently referred to as so-called "short channel effects." In order to continue Moore's Law, tremendous efforts are needed to address the issues of marginalities, variabilities and challenges appearing in the continued scaling towards 20/40 nm VLSI (very large scale integration) MOS technologies such that all the marginalities in each individual process step and all variabilities are properly addressed and, at best, reduced.

With regard to FIGS. 1a and 1b, conventional FEOL processing after silicide formation is shown and described below. FIG. 1a schematically illustrates, in a cross-sectional view, two gate structures 120 and 140 formed on a semiconductor substrate 100, conventionally a silicon substrate. In alignment with the gate structures 120, 140, source/drain regions 112, 114 and 116 are formed within the semiconductor substrate 100. Within the source/drain regions 112, 114 and 116, respective silicide regions 113, 115 and 117 are formed.

The gate structures 120 and 140 comprise respective gate dielectrics 124 and 144, respective gate electrode material layers 126 and 146, e.g., polysilicon material layers, and respective sidewall spacers 128 and 148. The sidewall spacers 128 and 148 cover sidewalls of the respective gate electrode material layers 126 and 146. During a preceding silicidation process, silicide contacts 164 and 168 are formed on the gate electrode material layers 126 and 146.

A distance between two neighboring gate structures, i.e., a distance $d_1$ between the gate structures 120 and 140, continuously decreases with increasing integration density, resulting in issues, such as the formation of voids when filling the space between neighboring gate structures with contact isolation material (which makes the formation of contacts more difficult), with decreasing distance $d_1$ and, accordingly, when less space is available between neighboring gate structures. Generally, the decreasing distance $d_1$ results in less space for implantation and silicidation. A proposal for resolving this situation including a process step for removing spacers after silicide formation is indicated in FIG. 1a by a process step 170. According to conventional techniques, the process step 170 represents a dry etch process that is performed to remove the sidewall spacers 128 and 148 in order to increase the space between neighboring gate structures, i.e., the neighboring gate structures 140 and 120.

With regard to FIG. 1b, the gate structures 120 and 140 are illustrated after the process step 170 is completed. Due to the spacer removal after completion of the process step 170, the distance between the neighboring gate structures 120 and 140 is increased to a distance indicated by $d_2$. In spite of the increased space between the neighboring gate structures 120 and 140, the application of the process 170 results in a loss of active silicon and silicide material, as indicated in FIG. 1b by the broken lines S1, S2 and S3. Herein, each of the broken lines S1, S2 and S3 indicates a surface level of respective source/drain regions 112, 114, 116 and respective silicide regions 113, 115, 117 prior to the application of the process 170. The silicon recess and according silicide loss caused by the process 170 gives rise to several issues, such as a possible ILD pinching during subsequent ILD-related process steps, such as TPEN deposition, and a decrease in a serial resistance due to the caused silicide loss. Therefore, conventional processes in accordance with current VLSI MOS technologies potentially result in devices of significantly degraded device performance.

In view of the above discussion of current VLSI MOS technologies, it is, therefore, desirable to provide a method of forming a semiconductor device structure and such a semiconductor device structure that overcomes the above-described situation.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with a first aspect of the present disclosure, a semiconductor device structure is provided. According to some illustrative embodiments herein, the semiconductor device structure is formed by providing source/drain regions within a semiconductor substrate in alignment with a gate structure formed over the semiconductor substrate, wherein the gate structure has a gate electrode structure, a first sidewall spacer and a second sidewall spacer, the first sidewall spacer covering sidewall surfaces of the gate electrode structure and the second sidewall spacer being formed on the first sidewall spacer. Furthermore, forming the semiconductor device structure may include removing the second sidewall spacer so as to expose the first sidewall spacer, forming a third sidewall spacer on a portion of the first sidewall spacer such that the first sidewall spacer is partially exposed, and forming silicide regions in alignment with the third sidewall spacer in the source/drain regions.

In accordance with a second aspect of the present disclosure, a semiconductor device structure is provided. In some illustrative embodiments herein, the semiconductor device structure may include a first active region provided in a semiconductor substrate at an upper surface of the semiconductor substrate, a gate structure disposed on the first active region, the gate structure comprising a gate electrode structure, a first sidewall spacer covering sidewall surfaces of the gate electrode structure and a second sidewall spacer formed on the first sidewall spacer, wherein the second sidewall spacer partially covers sidewall surfaces of the first sidewall spacer such that an upper sidewall surface portion of the first sidewall spacer remains uncovered by the second sidewall spacer, the upper sidewall surface portion having at least 10% of the sidewall surface of the first sidewall spacer. Furthermore, the semiconductor device structure may include source/drain regions formed in the first active region in alignment with the gate structure and silicide regions formed in the first active region in alignment with the second sidewall spacer.

BRIEF DESCRIPTION OF THE DRAWINGS

The disclosure may be understood by reference to the following description taken in conjunction with the accompanying drawings, in which like reference numerals identify like elements, and in which:

FIGS. 2a-2j schematically illustrate, in cross-sectional views, a process of forming a semiconductor device structure in accordance with some illustrative embodiments of the present disclosure.

Figure 1A:
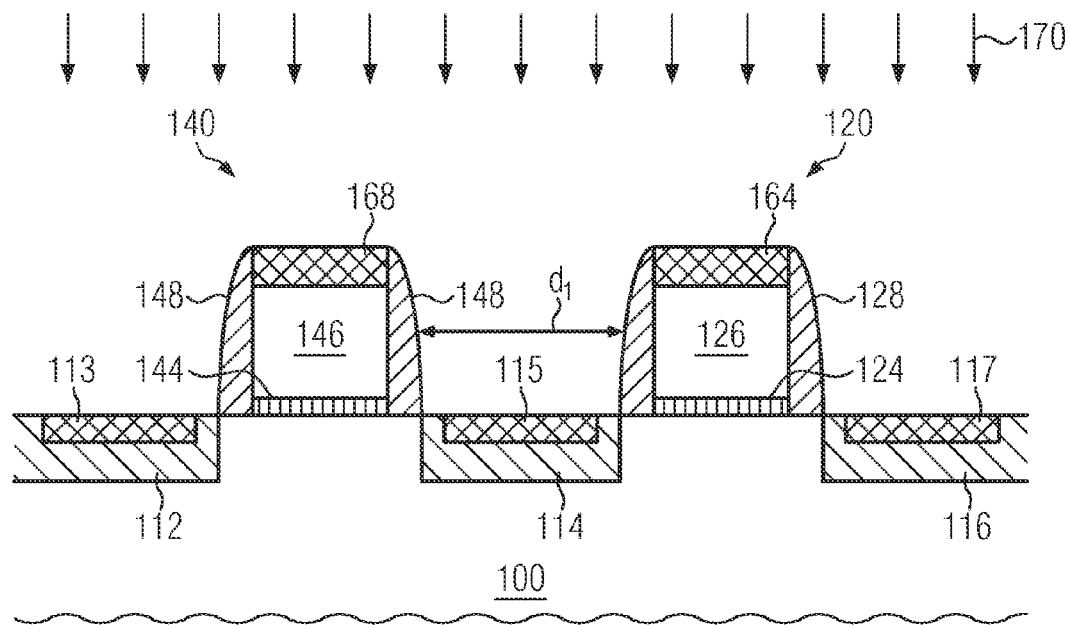
FIGS. 1a and 1b schematically show two neighboring gate structures during a conventional processing after silicidation is performed.
Figure 1B:
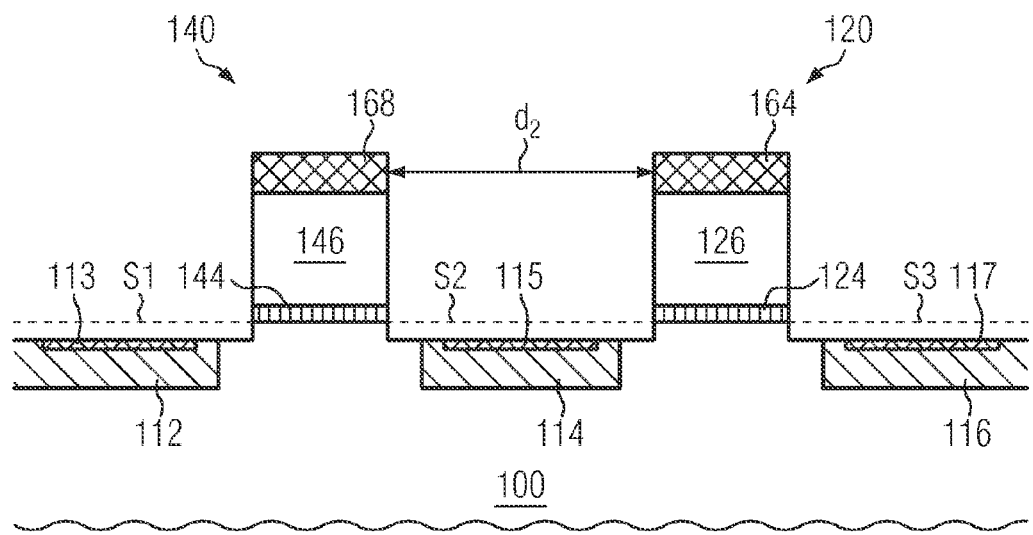

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to semiconductor circuit elements comprising semiconductor devices that are integrated on or in a chip, such as FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor circuit elements of the present disclosure, and particularly semiconductor devices as illustrated by means of some illustrative embodiments, concern elements and devices which are fabricated by using advanced technologies. Semiconductor circuit elements of the present disclosure are fabricated by technologies applied to approach technology nodes smaller than 100 nm, for example smaller than 50 nm or smaller than 35 nm, i.e., ground rules smaller or equal to 45 nm may be imposed. The person skilled in the art will appreciate that the present disclosure suggests semiconductor circuit elements having structures with minimal length and/or width dimensions smaller than 100 nm, for example smaller than 50 nm or smaller than 35 nm. For example, the present disclosure may provide for semiconductor devices fabricated by using 45 nm technologies or below, e.g., 28 nm or below.

The person skilled in the art understands that semiconductor devices may be fabricated as MOS devices, such as P-channel MOS transistors or PMOS transistors and N-channel transistors or NMOS transistors, and both may be fabricated with or without mobility-enhancing stressor features or strain-inducing features. A circuit designer can mix and match device types, using PMOS and NMOS devices, stressed and unstressed, to take advantage of the best characteristics of each device type as they best suit the semiconductor circuit element being designed.

In some of the various aspects of the present disclosure, a method of forming a semiconductor device structure may be provided, wherein source/drain regions are provided within a semiconductor substrate in alignment with the gate structure formed over the semiconductor substrate. The gate structure may have a gate electrode structure, a first sidewall spacer and a second sidewall spacer, wherein the first sidewall spacer may cover sidewall surfaces of the gate electrode structure and the second sidewall spacer may be formed on the first sidewall spacer. In accordance with some illustrative embodiments herein, the method may further comprise removing the second sidewall spacer so as to expose the first sidewall spacer, forming a third sidewall spacer on a portion of the first sidewall spacer such that the first sidewall spacer is partially exposed, and forming silicide regions in alignment with the third sidewall spacer in the source/drain regions.

In accordance with some illustrative embodiments herein, the third sidewall spacer may be formed by depositing a sidewall spacer-forming material over the semiconductor substrate and by etching the deposited sidewall spacer-forming material with an etchant having a lateral component. In accordance with some illustrative examples herein, the first sidewall spacer may be used as an etch stop during the etching of the deposited sidewall spacer-forming material. In accordance with some special illustrative examples herein, the first sidewall spacer may be formed by silicon oxide material and the second and third sidewall spacers may be formed by silicon nitride material.

In accordance with some illustrative embodiments of the present disclosure, a strongly-doped region may be formed within the semiconductor substrate adjacent to the source/drain regions for further providing a diffusion resistor structure. In accordance with some illustrative examples herein, the third sidewall spacer may be formed by depositing a sidewall spacer-forming material over the gate structure and the diffusion resistor structure, forming a masking pattern over the diffusion resistor structure, and etching the deposited sidewall spacer-forming material such that the third sidewall spacer may be formed over the first sidewall spacer and two surface regions of the strongly-doped region may be left uncovered. In accordance with some special illustrative examples herein, silicide resistor regions may be formed in the two exposed regions of the strongly-doped region when the silicide regions are formed in the source/drain regions.

In accordance with some illustrative embodiments of the present disclosure, a shallow trench isolation structure may be provided adjacent to at least one of the source/drain regions, wherein the shallow trench isolation structure may have a dummy gate structure formed thereon, and a fourth sidewall spacer may be formed on sidewalls of the dummy gate structure when the third sidewall spacer is formed. In accordance with some further special illustrative examples herein, embedded stressor regions may be provided at opposing sides of the gate structure in the semiconductor material such that the shallow trench isolation structure may border at least one of the embedded stressor regions, wherein the fourth sidewall spacer may portion-wise cover the at least one of the embedded stressor regions bordering the STI structure. In accordance with further special illustrative examples herein, the embedded stressor regions may be formed by embedding silicon/germanium material into the semiconductor material in alignment with the gate structure.

In accordance with some illustrative embodiments of the present disclosure, an interlayer dielectric liner may be further deposited over the semiconductor substrate after the silicide regions are formed. In accordance with some illustrative examples herein, contact elements to the silicide regions may be formed in the interlayer dielectric liner in alignment with the third sidewall spacer. In accordance with some illustrative examples, an etch stop liner may be formed before the interlayer dielectric liner is deposited, wherein the interlayer dielectric liner may be deposited on the etch stop liner.

In accordance with other aspects of the present disclosure, a semiconductor device structure may be provided, the semiconductor device structure comprising a first active region provided in a semiconductor substrate at an upper surface of the semiconductor substrate, a gate structure disposed on the first active region, wherein the gate structure may comprise a gate electrode structure, a first sidewall spacer covering sidewall surfaces of the gate electrode structure and a second sidewall spacer formed on the first sidewall spacer, the second sidewall spacer partially covering the first sidewall spacer, source/drain regions formed in the first active region in alignment with the gate structure, and silicide regions formed in the first active region in alignment with the second sidewall spacer. Herein, the second sidewall spacer partially covering sidewall surfaces of the first sidewall spacer may be provided such that an upper sidewall surface portion of the first sidewall spacer remains uncovered by the second sidewall spacer, the upper sidewall surface portion having at least 10% of the sidewall surface of the first sidewall spacer.

In accordance with some illustrative embodiments herein, the second sidewall spacer may have a substantially triangularly-shaped cross-section along a direction connecting the source/drain regions.

In accordance with some illustrative embodiments herein, the second sidewall spacer may cover the first sidewall spacer up to a height level relative to the upper surface, wherein the height level is substantially smaller than a total height of the gate structure relative to the upper surface. In accordance with some special illustrative examples herein, the height level may be equal to or smaller than ¾ of the total height.

In accordance with some illustrative embodiments herein, the semiconductor device structure may comprise an interlayer dielectric liner formed over the gate structure and contact elements contacting the silicide regions and being formed within the interlayer dielectric liner in alignment with the second sidewall spacer.

In accordance with some illustrative embodiments herein, the semiconductor device structure may further comprise a shallow trench isolation structure having a dummy gate structure formed thereon and embedded stressor regions embedded into the first active region at opposing sides of the gate structure, wherein the shallow trench isolation structure may border at least one of the embedded stressor regions and the dummy gate structure may comprise a dummy gate electrode structure, a third sidewall spacer covering sidewall surfaces of the dummy gate electrode structure and a fourth sidewall spacer formed on the third sidewall spacer. In some illustrative examples, the fourth sidewall spacer may partially cover the third sidewall spacer and the at least one of the embedded stressor regions bordering the shallow trench isolation structure.

In accordance with some illustrative embodiments herein, the semiconductor device structure may further comprise a resistor device having a second active region formed in the semiconductor substrate at the upper surface adjacent to the first active region, wherein the second active region may comprise a strongly-doped portion which may be partially covered by a patterned dielectric material, and wherein the strongly-doped portion may have resistor silicide regions formed in alignment with the patterned dielectric material.

Figure 2A:
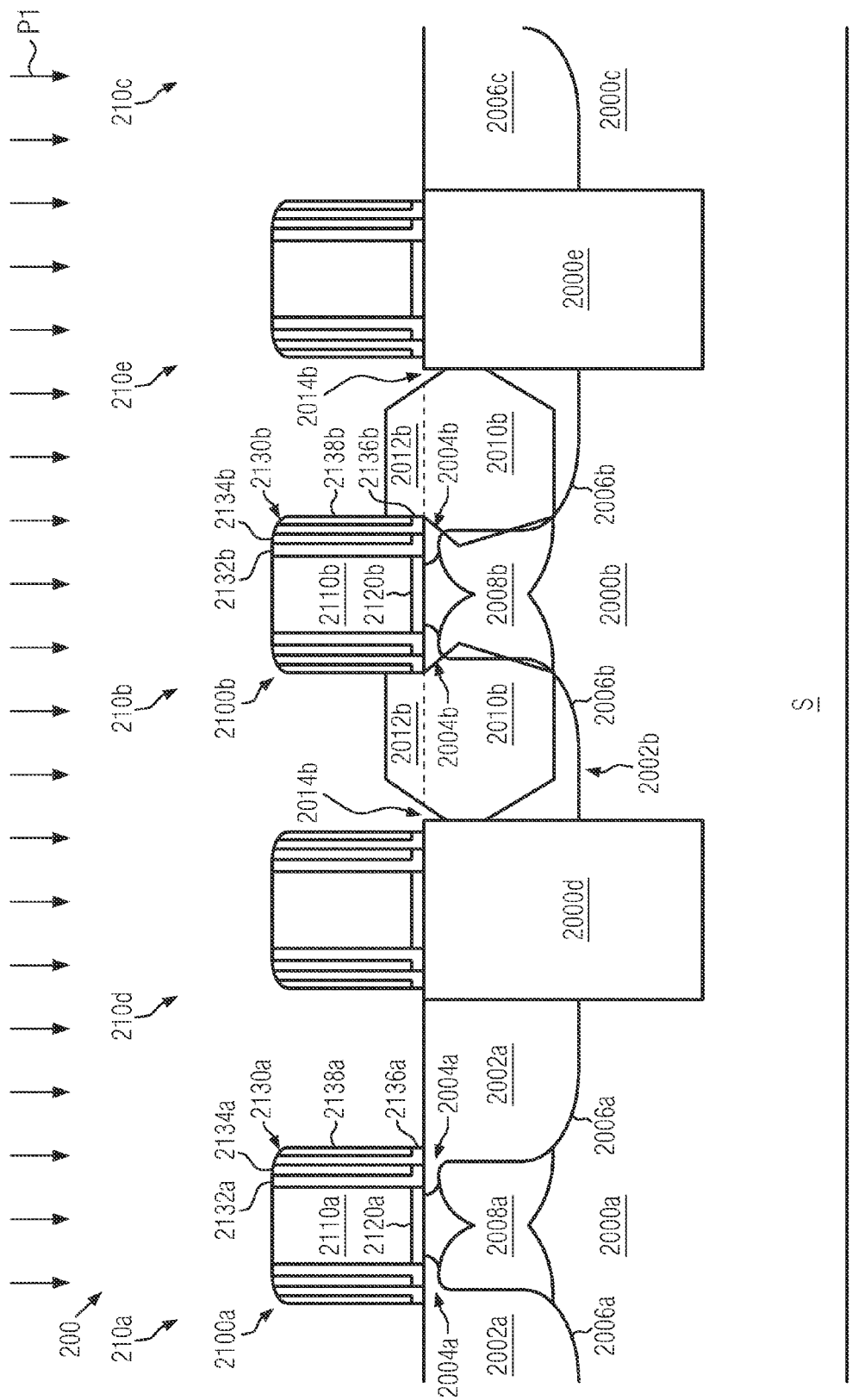

FIG. 2a schematically illustrates, in a cross-sectional view, a semiconductor device structure 200 provided in and over a semiconductor substrate S at a stage during fabrication, in which a first semiconductor device 210a, a second semiconductor device 210b and a third semiconductor device 210c are provided in and over the semiconductor substrate S. The first semiconductor device 210a may be separated from the second semiconductor device 210b by a first shallow trench isolation (STI) region 2000d formed within the semiconductor substrate S at an upper surface of the semiconductor substrate S. The second semiconductor device 210b may be separated from the third semiconductor device 210c by a second STI region 2000e formed in the semiconductor substrate S at the upper surface of the semiconductor substrate S.

The person skilled in the art will appreciate that the first and second STI regions 2000d and 2000e are optional and may be omitted in accordance with some alternative embodiments which are not illustrated in the figure. Furthermore, in accordance with still another alternative embodiment of the present disclosure, one or more further semiconductor devices (not illustrated) may be provided in between the first and second semiconductor devices 210a, 210b and/or the second and third semiconductor devices 210b, 210c, two or more of the further semiconductor devices being possibly separated by one or more STI regions (not illustrated).

The person skilled in the art will appreciate that the semiconductor substrate S may be, for example, a bulk substrate or may represent an active layer of a silicon-on-insulator (SOI) substrate or of a silicon/germanium-on-insulator (SGOI) substrate. In general, the terms "substrate," "semiconductor substrate" or "semiconducting substrate" should be understood to cover all semiconductor materials in all forms of such semiconductor materials and no limitation to a special kind of substrate is intended. In an SOI configuration, the semiconductor substrate S representing an active layer may have a buried oxide layer (BOX layer) formed below.

In accordance with some illustrative embodiments of the present disclosure, the semiconductor substrate S may be doped with dopants of an appropriate conductivity type, such as N-type dopants or P-type dopants. Alternatively, the semiconductor substrate S may be undoped, apart from optional doped regions formed in close proximity to the upper surface of the semiconductor substrate S represented by a first active region 2000a, a second active region 2000b and a third active region 2000c. The first semiconductor device 210a may be formed in and over the first active region 2000a, the second semiconductor device 210b may be formed in and over the second active region 2000b and the third semiconductor device 210c may be formed in and over the third active region 2000c.

In accordance with some illustrative embodiments of the present disclosure, the first semiconductor device 210a may comprise a first gate structure 2100a formed on the first active region 2000a. The first gate structure 2100a may have a gate electrode structure 2110a disposed on a gate isolating structure 2120a. In some illustrative examples of the present disclosure, the gate electrode structure 2110a comprises polysilicon, amorphous silicon or a gate electrode metal. The gate isolating structure 2120a may be formed by one or more layers comprising a high-k material, e.g., hafnium oxide, silicon oxide, hafnium oxynitride or combinations thereof, and a work function material, such as TiN and the like. Sidewall surfaces of the gate electrode structure 2110a and a gate insulating structure 2120a may be covered by a first sidewall spacer structure 2130a formed adjacent to the gate electrode structure 2110a and the gate insulating structure 2120a.

In accordance with some illustrative embodiments of the present disclosure, the first sidewall spacer structure 2130a may be formed by a first sidewall spacer layer 2132a covering the sidewall surface of the gate electrode structure 2110a, as illustrated in FIG. 2a. On the first sidewall spacer layer 2132a, a first sidewall spacer liner 2134a may be formed. On the first sidewall spacer liner 2134a, a second sidewall spacer layer 2136a may be formed, on which a second sidewall spacer liner 2138a may be provided.

Within the first active region 2000a, source/drain regions 2002a may be formed in alignment with the first gate structure 2100a. The source/drain regions 2002a may have been implanted during previously-performed implantation sequences by implanting appropriate dopants into the active region 2000a. In accordance with some illustrative embodiments of the present disclosure, the source/drain regions 2002a may comprise source/drain extension regions 2004a and deep source/drain regions 2006a. The source/drain extension regions 2004a may be, for example, formed by implanting dopants into the active region 2000a in alignment with the first sidewall spacer layer 2132a and optionally the first sidewall spacer liner 2134a. The deep source/drain regions 2006a may be formed by implanting dopants into the first active region 2000a in alignment with the second sidewall spacer layer 2136a and optionally the second sidewall spacer liner 2138a.

As illustrated in FIG. 2a, halo regions 2008a may be formed in the first active region 2000a, the halo regions being formed in accordance with known processing techniques, e.g., tilted implantation techniques performed prior to the formation of the deep source/drain regions 2006a and particularly prior to formation of the second sidewall spacer layer 2136a. However, this does not pose any limitations to the present disclosure and the person skilled in the art will appreciate that the halo regions 2008a may be omitted in alternative process flows (not illustrated).

In accordance with some illustrative embodiments of the present disclosure, the second semiconductor device 210b may comprise a second gate structure 2100b formed on the second active region 2000b. The second gate structure 2100b may have a gate electrode structure 2110b disposed on a gate isolating structure 2120b. In some illustrative examples of the present disclosure, the gate electrode structure 2110b may comprise polysilicon, amorphous silicon or a gate electrode metal. The gate isolating structure 2120b may be formed by one or more layers comprising a high-k material, e.g., hafnium oxide, silicon oxide, hafnium oxynitride or combinations thereof, and a work function material, such as TiN and the like. Sidewall surfaces of the gate electrode structure 2110b and a gate insulating structure 2120b may be covered by a second sidewall spacer structure 2130b formed adjacent to the gate electrode structure 2110b and the gate insulating structure 2120b.

In accordance with some illustrative embodiments of the present disclosure, the second sidewall spacer structure 2130b may be formed by a third sidewall spacer layer 2132b covering the sidewall surface of the gate electrode structure 2110b, as illustrated in FIG. 2a. On the third sidewall spacer layer 2132b, a third sidewall spacer liner 2134b may be formed. On the third sidewall spacer liner 2134b, a fourth sidewall spacer layer 2136b may be formed, on which a fourth sidewall spacer liner 2138b may be provided. In accordance with some alternative examples herein, the fourth sidewall spacer liner 2138b or the fourth sidewall spacer layer 2136b may be optional.

Within the second active region 2000b, source/drain regions 2002b may be formed in alignment with the second gate structure 2100b. The source/drain regions 2002b may have been implanted during previously-performed implantation sequences by implanting appropriate dopants into the active region 2000b. In accordance with some illustrative embodiments of the present disclosure, the source/drain regions 2002b may comprise source/drain extension regions 2004b and deep source/drain regions 2006b. The source/drain extension regions 2004b may be, for example, formed by implanting dopants into the active region 2000a in alignment with the third sidewall spacer layer 2132b and optionally the third sidewall spacer liner 2134b. The deep source/drain regions 2006b may be formed by implanting dopants into the second active region 2000b in alignment with the fourth sidewall spacer layer 2136b and optionally the fourth sidewall spacer liner 2138b.

As illustrated in FIG. 2a, halo regions 2008b may be formed in the second active region 2000b, the halo regions being formed in accordance with known processing techniques, e.g., tilted implantation techniques performed prior to the formation of the deep source/drain regions 2006b and particularly prior to formation of the fourth sidewall spacer layer 2136b. However, this does not pose any limitation on the present disclosure and the person skilled in the art will appreciate that the halo regions 2008b may be omitted in alternative process flows (not illustrated).

Referring to FIG. 2a, embedded silicon germanium (eSiGe) regions 2010b may be formed within the second active region 2000b, the eSiGe regions 2010b may optionally have raised regions 2012b which raise above a surface level of the upper surface of the semiconductor substrate S, which is indicated by the broken lines in FIG. 2a. The eSiGe regions 2010b may be formed in accordance with known processing, such as the formation of sigma-shaped cavities within the second active region 2000b in alignment with the second gate structure 2100b and subsequently epitaxially growing SiGe material within the accordingly-formed sigma-shaped cavities for at least filling, or optionally overfilling, the sigma-shaped cavities so as to form the eSiGe regions 2010b and optionally the raised regions 2012b. The person skilled in the art will appreciate that a separation between the raised regions 2012b and the second gate electrode structure 2110b may be adjusted by the second sidewall spacer structure 2130b.

With the eSiGe regions 2010b being formed adjacent to the first and second STI regions 2000d, 2000e and the first and second STI regions 2000d, 2000e bordering the eSiGe regions 2010b, voids 2014b can be formed between the first and second STI regions 2000d, 2000e and the eSiGe regions 2010b, due to a low growth rate of the SiGe material on the insulating material of the first and second STI regions 2000d, 2000e.

With regard to the third semiconductor device 210c, a diffusion resistor structure may be formed in and over the third active region 2000c. Herein, at the stage shown in FIG. 2a, a resistor well 2006c may be provided in the third active region 2000c. The resistor well may be formed by implanting dopants of a desired conductivity type, such as P-type dopants or N-type dopants, into the third active region 2000c. The person skilled in the art will appreciate that the formation of the resistor well 2006c may be achieved when forming at least one of the deep source/drain regions 2006a and 2006b. Alternatively, the first and second semiconductor devices 210a, 210b may be masked before forming the resistor well 2006c such that dopants for forming the resistor well 2006c are not implanted into the first and second active regions 2000a, 2000b.

In accordance with some illustrative embodiments which are illustrated in FIG. 2a, dummy gate structures 210d, 210e may be formed on the first and second STI regions 2000d, 2000e. The dummy gate structures 210d, 210e may be substantially similar to the first and second gate structures 2100a, 2100b and may be fabricated when forming the first and second gate structures 2100a, 2100b.

In accordance with some illustrative embodiments of the present disclosure, the semiconductor device structure 200 may be exposed to a first process P1, as illustrated in FIG. 2a. The first process P1 may be performed after a rapid thermal anneal step (not illustrated) is completed, in which all dopants are activated, including the deep source/drain implants, and possible crystal damages are healed.

The person skilled in the art will appreciate that, by contrast, a silicidation process would be performed as a next step in conventional process flows in order to form silicide regions in alignment with the sidewall spacer structures 2130a, 2130b, i.e., in alignment with the second and fourth sidewall spacer liners 2138a and 2138b and the second and fourth sidewall spacer layers 2136a and 2136b. Thereafter, at least the second and fourth sidewall spacer liners 2138a and 2138b and the second and fourth sidewall spacer layers 2136a and 2136b would be removed.

In accordance with some illustrative embodiments of the present disclosure, the process P1 may be performed to remove the second and fourth sidewall spacer liners 2138a, 2138b from the first and second gate structures 2100a, 2100b. In accordance with some illustrative examples herein, particularly when the second and fourth sidewall spacer liners 2138a and 2138b comprise silicon nitride material, the process P1 may comprise an etching step including an $H_3PO_4$ wet etch, e.g., with hot phosphoric acid at about 80° C., or an optimized reactive ion etch (RIE) step. In case that the second and fourth sidewall spacer layers 2136a and 2136b are formed by silicon oxide material, the person skilled in the art will appreciate that the second and fourth sidewall spacer layers 2136a and 2136b may be used as etch stops during the process P1, wherein the second and fourth sidewall spacer liners 2138a and 2138b are completely removed and the second and fourth sidewall spacer layers 2136a and 2136b are completely exposed.

Figure 2B:
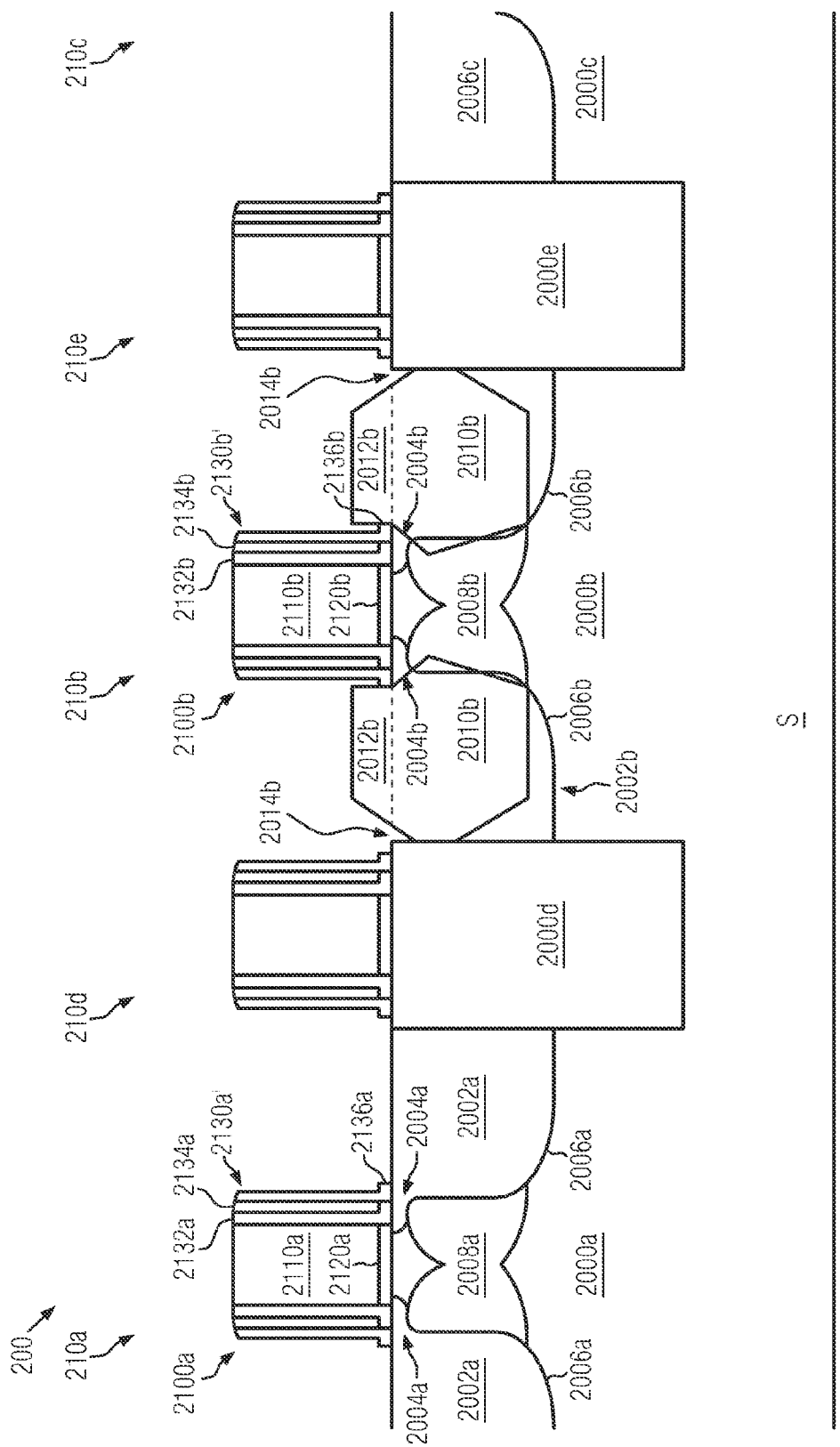

Referring to FIG. 2b, the semiconductor device structure 200 is illustrated in accordance with some illustrative embodiments of the present disclosure at a later stage during fabrication, particularly after the process P1 is completed. As illustrated in FIG. 2b, the second and fourth sidewall spacer liners 2136a, 2136b may be completely removed from the sidewall spacer structures 2130a, 2130b resulting in the sidewall spacer structures 2130a', 2130b'.

The person skilled in the art will appreciate that the dummy gate structures 210d, 210e, as these are similar to the first and second gate structures 2100a, 2100b, may have an accordingly-modified sidewall spacer structure. Therefore, the space adjacent to each of the gate structures 2100a, 2100b may be increased, i.e., the separation between neighboring gate structures may be increased at this stage during fabrication.

Figure 2C:
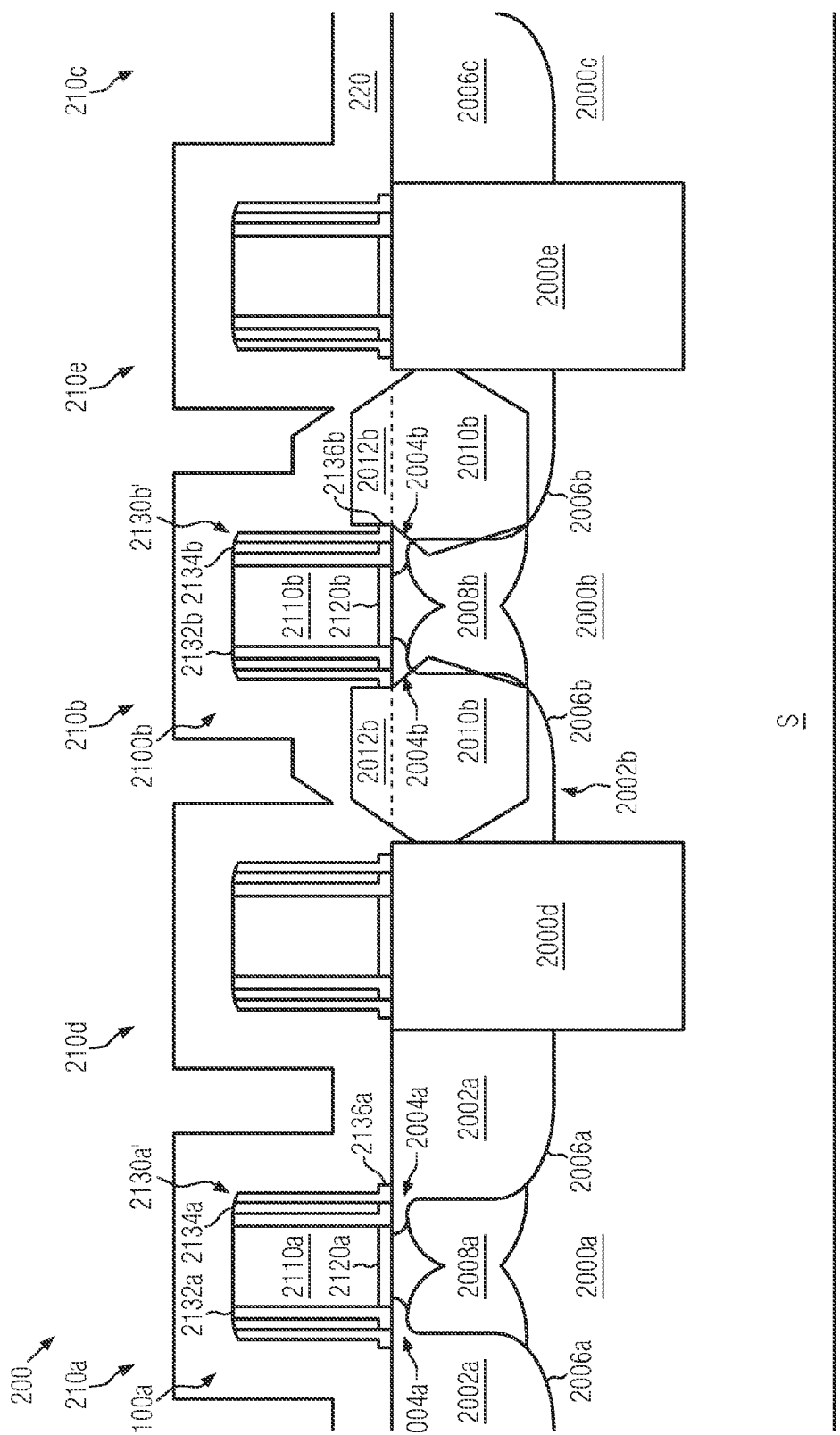

Referring to FIG. 2c, some illustrative embodiments of the present disclosure are depicted, wherein the semiconductor device structure 200 is illustrated at a later stage during fabrication, particularly after a protection layer 220 is formed over the semiconductor device structure 200 illustrated in FIG. 2b. In accordance with some illustrative embodiments herein, the protection layer 220 may be formed by depositing an insulating material on the semiconductor device structure 200, such as a SiN material. In accordance with some alternative embodiments of the present disclosure, an optional liner (not illustrated), e.g., a liner formed by silicon oxide material, may be deposited prior to the formation of the protection layer 220. Herein, the protection layer 220 may be formed on the liner (not illustrated), wherein the liner covers the semiconductor device structure 200 illustrated in FIG. 2b. The liner (not illustrated) may be used as an etch stop during subsequently-performed etch processes applied to the protection layer 220.

The person skilled in the art will appreciate that the protection layer 220 may be formed in a stressed state on the semiconductor device structure 200. For example, a SiN material having a certain stress level (e.g., up to substantially highly strained SiN material) may be formed on the semiconductor device structure 200 for imposing stress on the semiconductor devices 220a, 220b, 220c.

Figure 2D:
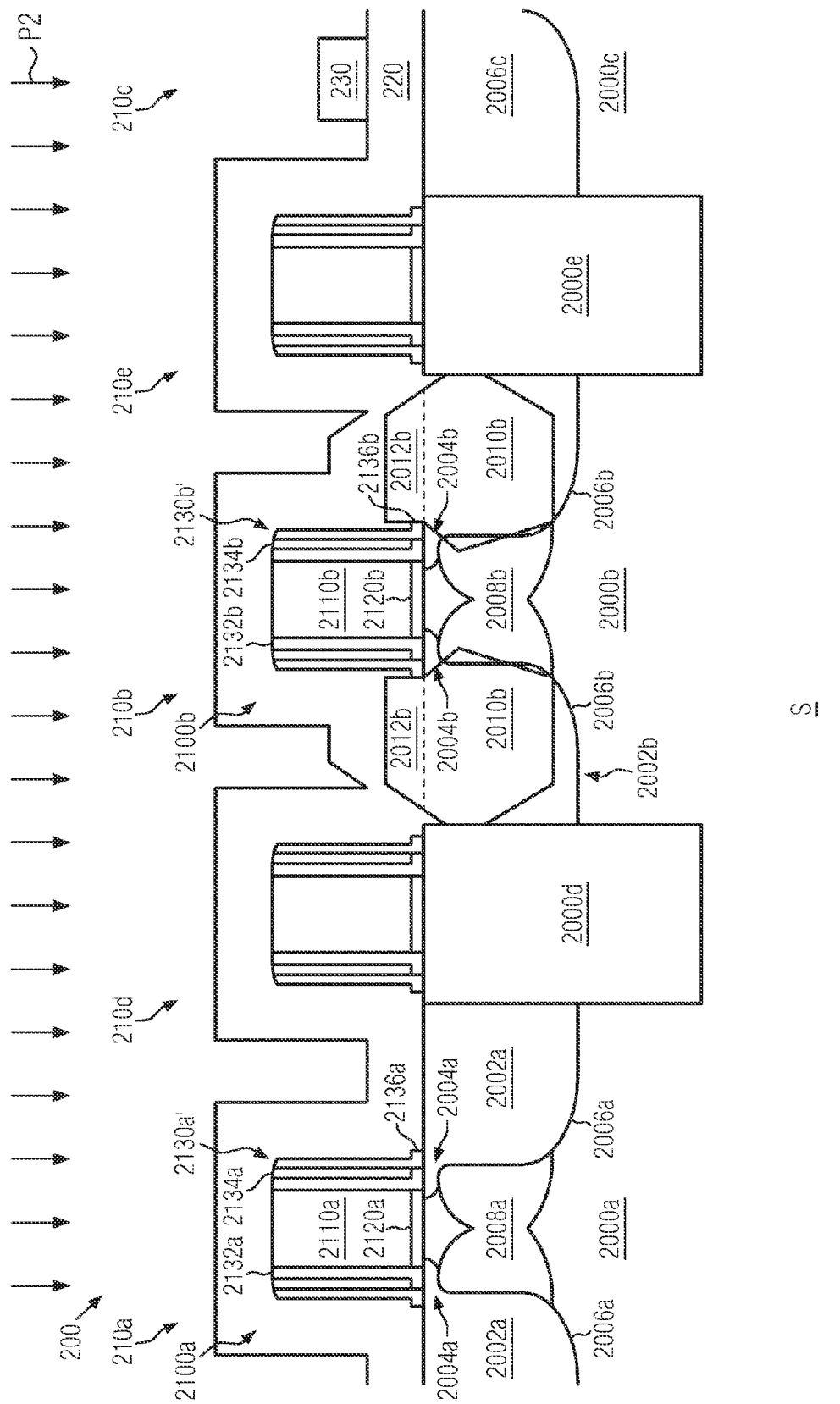

Referring to FIG. 2d, a hard mask structure may be formed over the third active region 2000c by forming a patterned resist 230, e.g., by depositing a resist layer and patterning the resist layer, for example, by lithographical methods, resulting in the patterned resist layer 230. The person skilled in the art will appreciate that the patterned resist layer 230 may define regions of the resistor well 2006c at the surface of the semiconductor substrate S that are protected by the protection layer 220.

Next, a process P2 may be performed. In accordance with some illustrative embodiments of the present disclosure, the process P2 may comprise an etch process applied to the semiconductor device structure 200. In accordance with some illustrative examples, the process P2 may comprise an etching process with an etchant having a lateral etching component. In some special illustrative but not limiting examples herein, the process P2 may comprise a reactive ion etch (RIE) step for etching the protection layer 220 in accordance with the patterned resist layer 230, wherein the RIE step may be configured to have a lateral etch component by, for example, appropriately adjusting parameters of the RIE step. For example, the RIE step may be configured to have a lateral etch component of substantially at least 0.1 of an etch component acting perpendicularly to the lateral etch component (lateral may be understood as being substantially parallel to the upper surface of the semiconductor substrate).

In some alternative embodiments, the process P2 may comprise an isotropic etch process, e.g., an isotropic etch process using phosphoric acid.

In accordance with some specially illustrative embodiments of the present disclosure, a triangularly shaped spacer profile may be created by adjusting the time from a main etch step and an over-etch of the process P2 in a way that less main etch and more over-etch may take place, wherein the over-etch etches a spacer such that the spacer is brought into a triangular shape because the over-etch is more sensitive and selective than the main etch. It is noted that an over-etch denotes an optional second etch step of an etch process, where an etch chemistry that maximizes the etch selectivity is employed. The over-etch generally removes residual material left by the previous etch with etch non-uniformity without or minimally damaging the underlying substrate/film. The etch rate is usually lower in the over-etch step. In accordance with some explicit examples of the present disclosure, a densification process may be performed after deposition of spacer material, e.g., nitride material (e.g., SiN), where the spacer etch process will react differently and an optimization may be performed to create a triangularly shaped spacer. The person skilled in the art will appreciate that at least one of the etch time and the trim time may be used for obtaining a desired triangular shape and the etch time and/or the trim time may be used as variables for optimizing the shaper process.

Figure 2E:
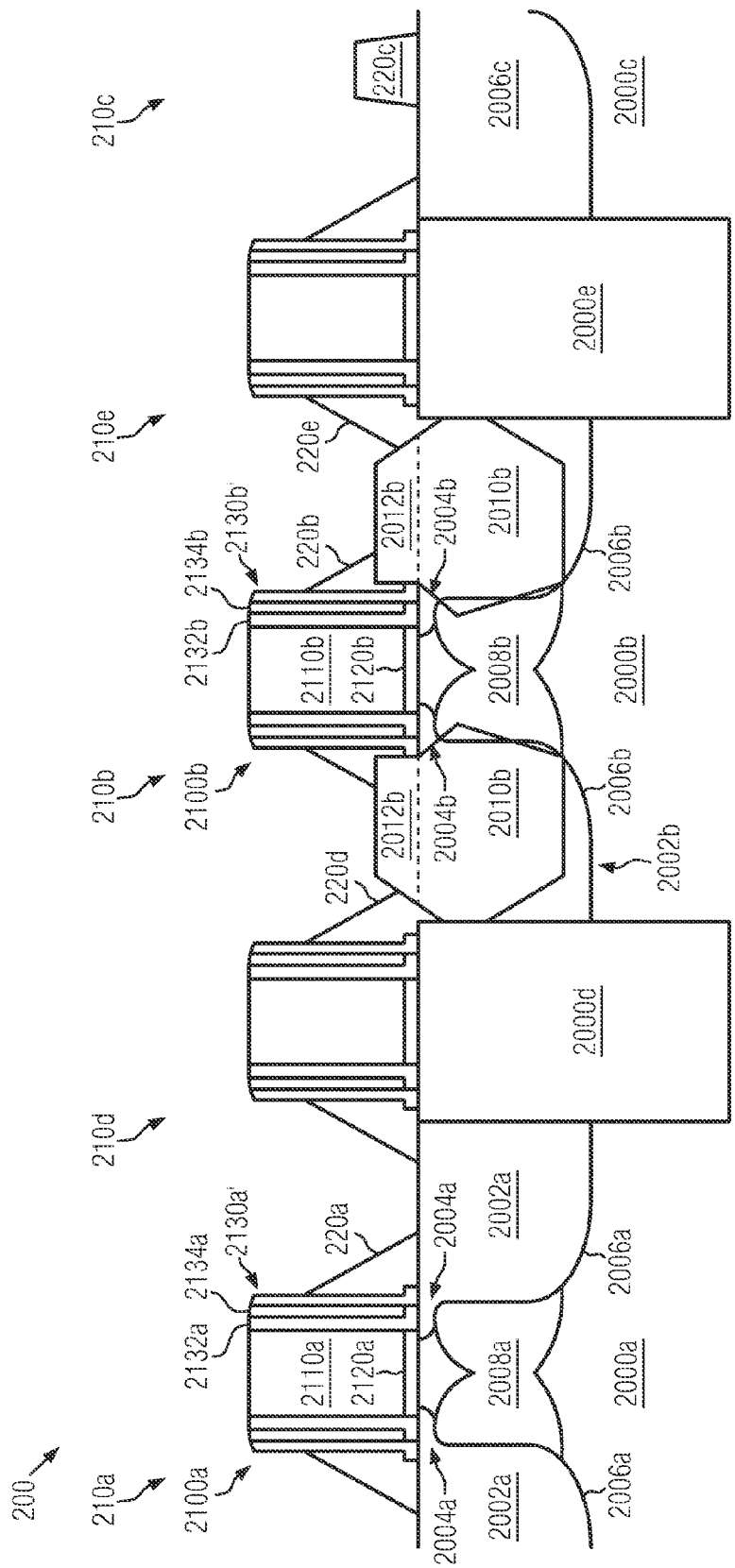

Referring to FIG. 2e, in which the semiconductor device structure 200 according to some illustrative embodiments of the present disclosure is illustrated at a stage during fabrication after the process P2 is completed. With regard to the third semiconductor device 210c, a patterned protection layer 220c may be formed on the resistor well 2006c, partially covering a surface of the resistor well 2006c and leaving two surface regions of the resistor well 2006c exposed to further processing. The patterned protection layer 220c may protect the resistor device 210c from cleaning and etching processes to be performed later.

In accordance with some illustrative embodiments of the present disclosure, the protection layer 220 (FIG. 2c) is etched, resulting in silicide spacers 220a, 220d, 220b and 220e. Herein, the silicide spacers 220a may be formed adjacent to the first gate structure 2100a. The silicide spacers 220b may be formed adjacent to the second gate structure 2100b. The silicide spacers 220d, 220e may be formed adjacent to the dummy gate structures 210d, 210e. In accordance with some illustrative examples herein, the silicide spacers 220a, 220b, 220d, 220e may substantially have a triangular shape and partially cover sidewall surfaces of the sidewall spacer layers 2136a, 2136b of the first and second gate structures 2100a, 2100b. In accordance with some special illustrative but not limiting examples herein, the spacers 220a, 220b, 220d, 220e assume a substantially triangular shape having a first dimension extending along a direction substantially parallel to the upper surface of the semiconductor substrate S, which first dimension is at least as long as a second dimension of the substantially triangular shape extending along the gate structure up to a certain height level, i.e., the first dimension is equal to or greater than the second dimension.

In accordance with some illustrative examples, the silicide spacers 220a, 220b may cover the sidewall spacer layers 2136a, 2136b up to a height level relative to the upper surface of the semiconductor substrate S, wherein the height level is substantially smaller than a total height of the gate structures 2100a, 2100b relative to the upper surface of the semiconductor substrate S. In some special illustrative examples herein, the height level may be equal to or smaller than ¾ of the total height, e.g., smaller than half of the total height, or equal to or smaller than 35% of the total height.

The person skilled in the art will appreciate that, in some illustrative embodiments, the silicide spacers may partially cover an upper surface of the respective source/drain regions 2002a, 2002b and may partially cover a portion of the resistor well 2006c. This may be due to the triangular shape of the silicide spacers 220a, 220b, 220d, 220e in some illustrative examples.

In some illustrative embodiments of the present disclosure, the silicide spacers 220d, 220e may at least partially fill the voids between the first and second STI regions 2000d, 2000e and the eSiGe regions 2010b. Accordingly, the silicide spacers 220d, 220e may protect the eSiGe regions 2010b at the boundary to the first and second STI regions 2000d, 2000e during subsequent processing, i.e., subsequently-performed etching and cleaning steps. Due to the partial covering of the sidewall spacer structures 2130a', 2130b' by the silicide spacers 220a, 220b, an increased space between neighboring gate structures may be maintained to a sufficient degree such that spacer removal or spacer shaper processes performed after the formation of silicide regions within the source/drain regions 2002a, 2002b may be obsolete.

Figure 2F:
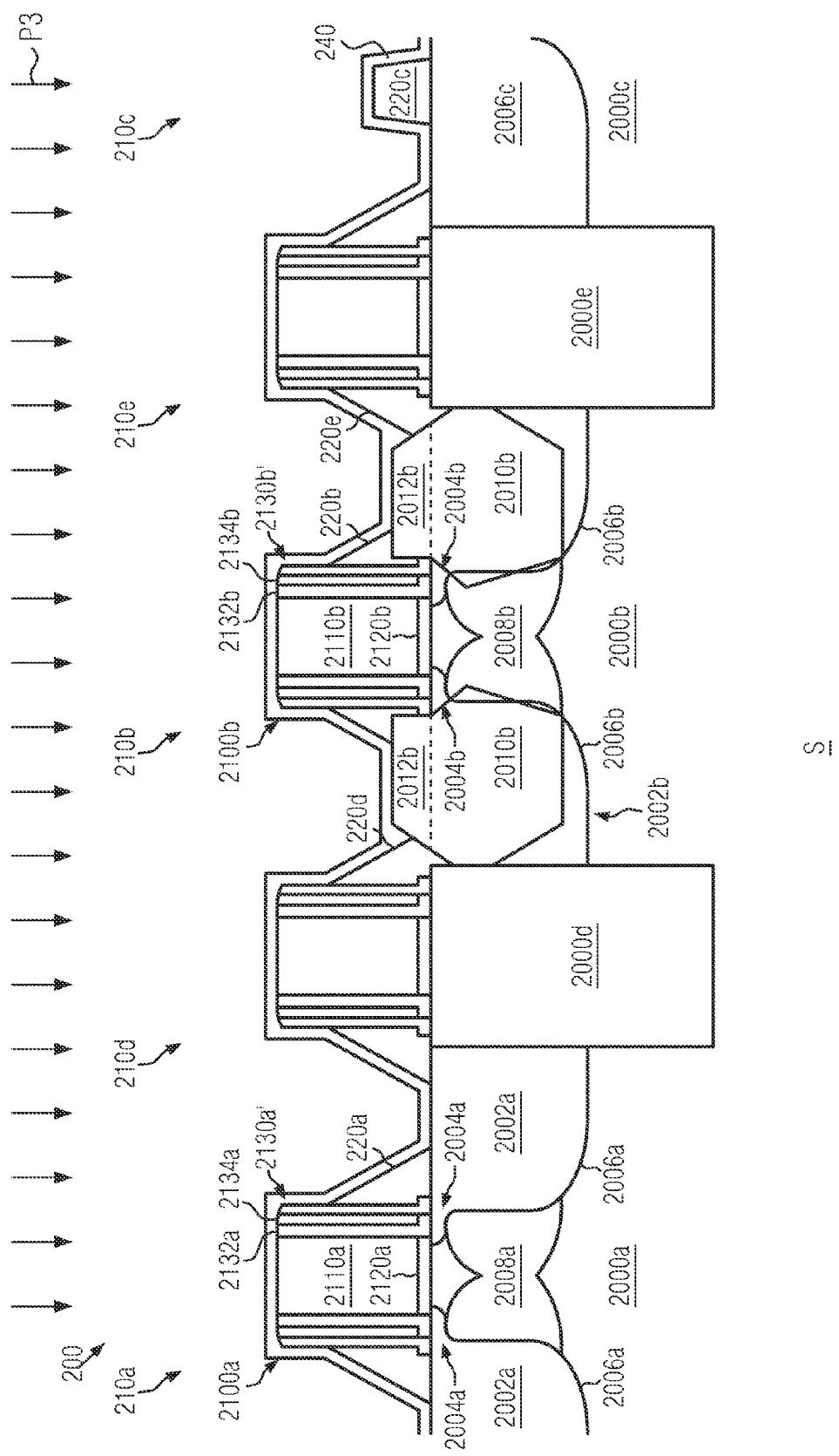

In accordance with some illustrative embodiments of the present disclosure, silicide regions may be subsequently formed within the source/drain regions 2002a, 2002b. Referring to FIG. 2f, a process P3 may be performed for forming a metal layer 240 over the semiconductor device structure 200 as illustrated in FIG. 2e. In accordance with some illustrative examples herein, the layer 240 may comprise one of nickel, cobalt and titanium.

Referring to FIG. 2g, an annealing process P4 and, subsequently, a process P5 may be performed and applied to the semiconductor device structure 200 as illustrated in FIG. 2F In accordance with the annealing process P4, a silicidation of the metal layer 240 on exposed surface areas of the source/drain regions 2002a, 2002b (i.e., the raised regions 2012b) and the resistor well 2006c and the gate electrode structures 2110a, 2110b may be achieved. In subsequently removing remaining metal material of the metal layer 240, particularly portions of the metal material of the metal layer 240 disposed on the silicide spacers 220a, 220b, 220d, 220e, the patterned protection layer 220c, the sidewall spacer structures 2130a', 2130b', the semiconductor device structure 200 as illustrated in FIG. 2g may be obtained and particularly the silicide regions 2140a, 2140b and 2140c may be formed in the source/drain regions 2006a, 2002b (i.e., the raised regions 2012b) and the resistor well 2006c, as well as the silicide regions 2142a, 2142b in the gate electrode structures 2110a, 2110b of the gate structures 2100a, 2100b may be formed. The person skilled in the art will appreciate that, due to the processes P3, P4 and P5, the silicide regions 2140a, 2140b, 2140c, 2142a, 2142b are formed on the gate structures 2100a, 2100b and the open active semiconductor material surfaces as defined by the silicide spacers 220a, 220b, 220d, 220e and the patterned protection layer 220c. In this sense, the processes P3, P4 and P5 may represent a silicidation process sequence.

As the boundary between the eSiGe regions 2010b to the STI regions 2000d, 2000e are protected, eSiGe material of the eSiGe regions 2010b is protected from removal by cleaning and etching steps during the silicidation process sequence P3 to P5. Accordingly, a solid contact etch, as well as a contact landing can be reliably provided during the processes as described with regard to the present disclosure.

Furthermore, due to the configuration of the silicide spacers 220a, 220b, 220d, 220e, the formation of sufficiently large space between neighboring gate structures, i.e., the gate structures 2100a, 2100b, 210d, 210e are created such that the risk of producing voids when depositing insulating material during subsequent process steps is at least reduced, if not avoided. The person skilled in the art will appreciate that, as opposed to conventional process flows, no additional spacer removal etch or spacer shaper etch after silicidation or salicidation is employed in the present disclosure. Accordingly, a deterioration of device performance and serial resistance is avoided because a potential attack on the silicide regions is not taking place.

Figure 2H:
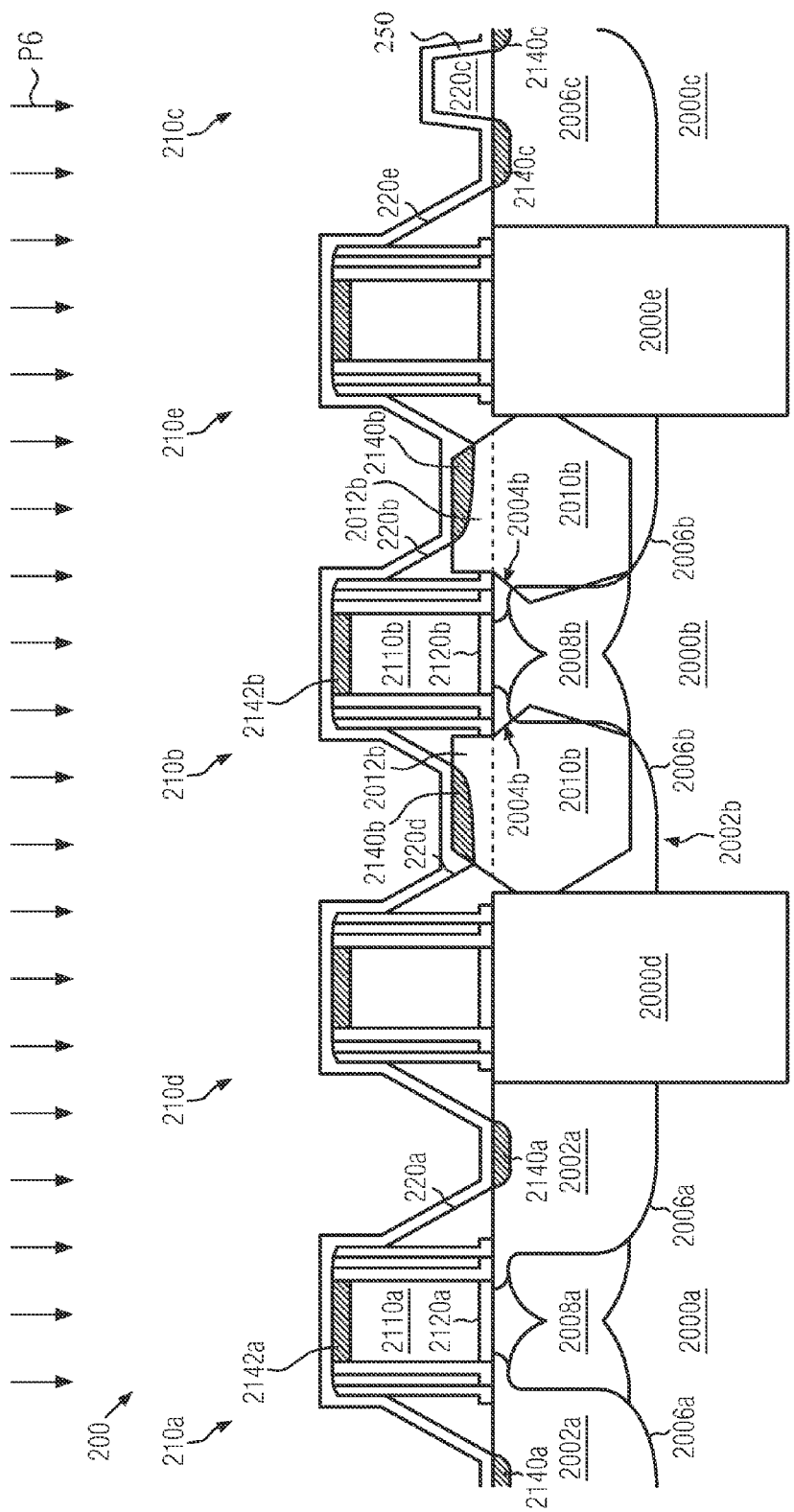

Referring to FIG. 2h, the semiconductor device structure 200 is illustrated at a later stage during fabrication, i.e., after the silicidation process sequence P3 to P5 is completed and an insulating liner 250 is deposited on the semiconductor device structure 200. In accordance with some illustrative examples herein, the liner 250 may be formed by silicon oxide material, e.g., the liner 250 may represent an $SiO_2$ liner.

After formation of the liner 250 over the semiconductor device structure 200, a process P6 may be performed. In accordance with some illustrative embodiments of the present disclosure, the process P6 may comprise a process for forming an interlayer dielectric material over the semiconductor device structure 200 as illustrated in FIG. 2h.

Figure 2I:
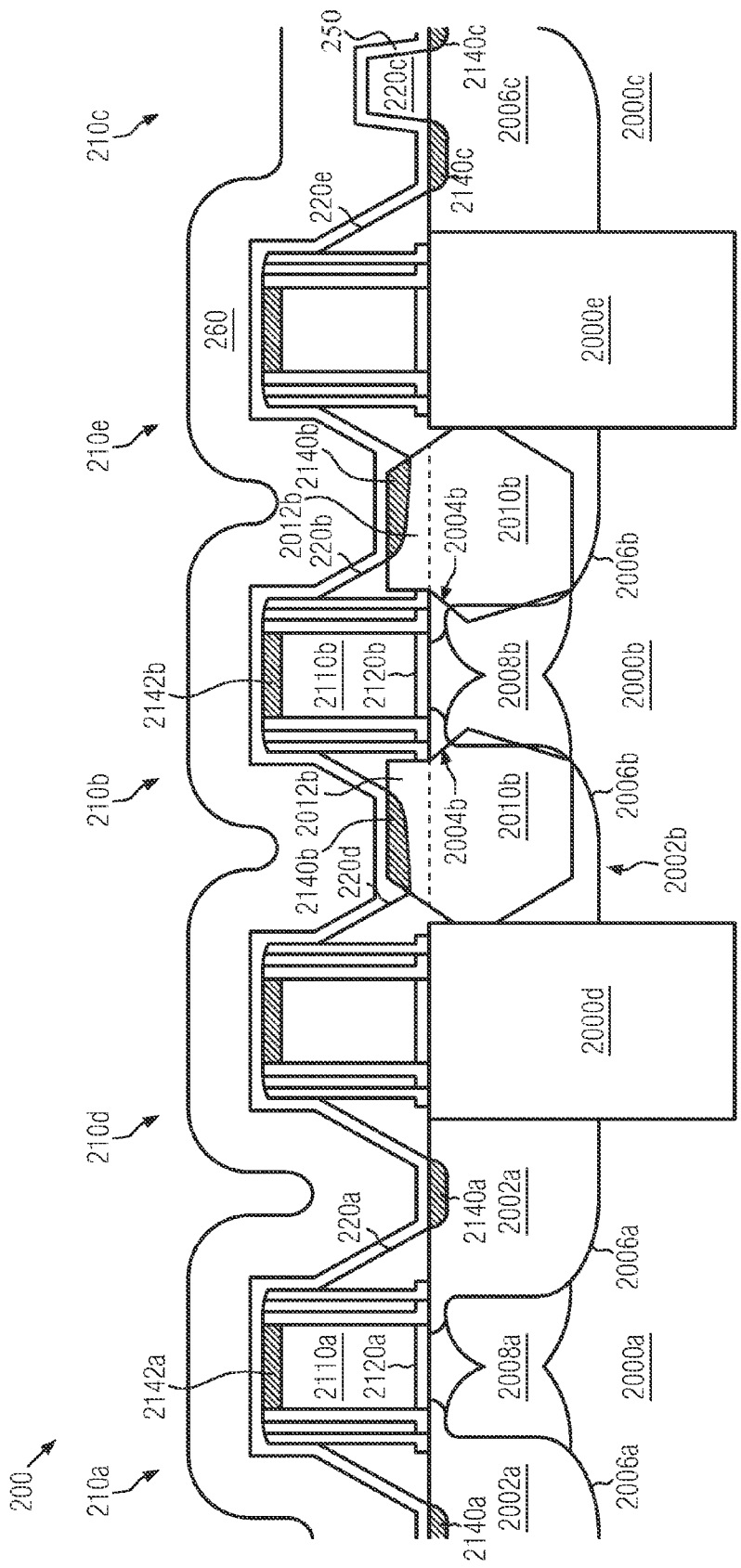

Referring to FIG. 2i, the semiconductor device structure 200 is illustrated at a later stage during fabrication, i.e., after the process P6 is completed. In accordance with some illustrative embodiments of the present disclosure, as a result of the process P6, an interlayer dielectric (ILD) liner 260 may be formed over the semiconductor substrate 200 and particularly over the liner 250. The person skilled in the art will appreciate that, due to the increased spacing between neighboring gate structures of the semiconductor device structure 200, the ILD liner 260 may have less voiding, if voiding is not completely avoided, relative to conventional semiconductor device structures.

Figure 2J:
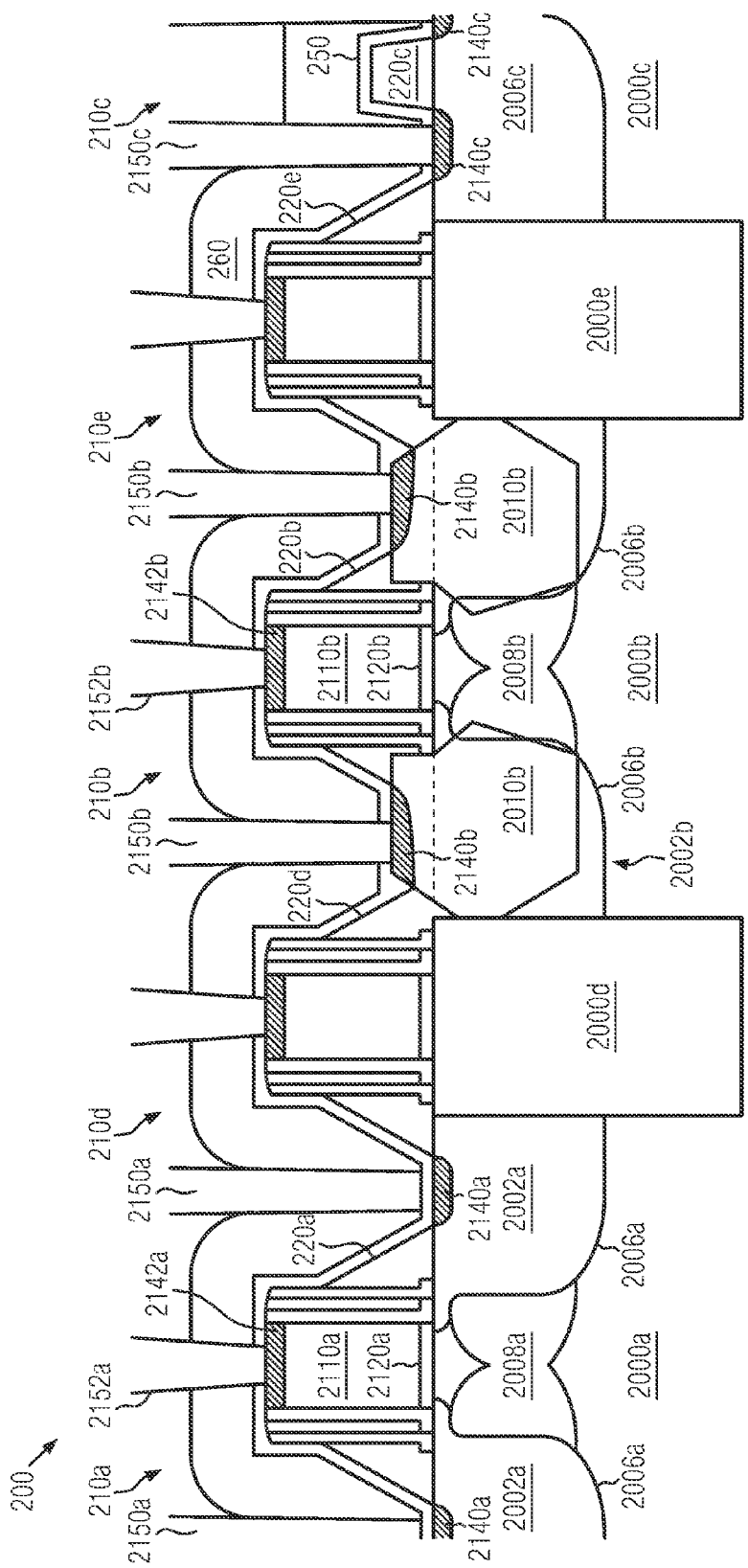

Referring to FIG. 2j, the semiconductor device structure 200 is illustrated at a later stage during fabrication, particularly after contact elements 2150a, 2150b, 2152a and 2152b are formed for contacting the respective silicide regions 2140a, 2140b, 2142a, 2142b. Furthermore, contact elements 2150c may be formed for contacting resistor silicide regions 2140c of the third semiconductor device 210c. The contact elements may be formed by known techniques, such as forming recesses in the ILD liner 260 and filling the recesses with metal material for forming the contact elements. The person skilled in the art will appreciate that the liner layer 250 may be used as an etch stop layer when etching recesses into the ILD liner 260.

As illustrated in FIG. 2j, the dummy gate structures 210d, 210e may be optionally contacted by contact elements. According contact elements may be formed for contacting at least one of the dummy gate structures 210d, 210e such that the at least one of the dummy gate structures 210d, 210e may be used as a resistor element in addition to the diffusion resistor structure provided by the semiconductor device 210c. This does not pose any limitation on the present disclosure and the person skilled in the art will appreciate that one or more contact elements contacting one or more dummy gate structures may be omitted or not further contacted in metallization layers to be formed above the semiconductor device structure 200 illustrated in FIG. 2j.

The person skilled in the art will appreciate that processing of the semiconductor device structure illustrated in FIG.

2*j* may proceed in forming an interlayer dielectric material (not illustrated) over the semiconductor device structure 200 and particularly on the ILD liner 260. The interlayer dielectric material (not illustrated) may be one of a silicon oxide material, e.g., $SiO_2$, or a low-k material as it is known in the art.

In accordance with some illustrative embodiments of the present disclosure, the first semiconductor device 210*a* and the second semiconductor device 210*b* may together form a CMOS device. For example, the first semiconductor device 210*a* may be provided as an NMOS device and the second semiconductor device 210*b* may be formed as a PMOS device, or vice versa (herein, embedded SiC material could be used instead of eSiGe or the eSiGe regions could be omitted). The person skilled in the art will appreciate that this is not limiting the disclosure but only exemplifies some illustrative examples.

In accordance with the various illustrative embodiments of the present disclosure as described above, a way of creating a cost-efficient silicide spacer is presented, where a late spacer removal etch or spacer shaper etch is removed, i.e., after a silicidation or salicidation process is performed, and the silicide material is not exposed to according etching and cleaning steps. Therefore, a decrease in the serial resistance of semiconductor devices and semiconductor device structures is avoided and, in comparison with conventional semiconductor devices and semiconductor device structures, device performance is increased.

Advantages associated with at least some of the illustrative embodiments as described above may comprise: a continuation of Moore's Law, particularly without employing complex and/or additional process steps, keeping fabrication costs low; increasing device performance as compared to conventional semiconductor devices and maintaining the device performance of advanced semiconductor device structures at a high level, increasing the yield; avoiding silicide loss and providing more space for contact elements to land in between neighboring gate structures; improving product and standard cell library performance; having a very low silicon loss, especially for narrow width/ min SA/LOD devices; silicon/germanium material at STI boundaries is conserved (more silicon/germanium material remains at the STI boundary), more silicon/germanium cap is present; less electrical variation due to less silicon recess occurs; lower contact resistance is achieved since no dry etch removal (spacer shaper etch and/or spacer shaper removal) after salicidation processes or silicidation processes is needed; an increased performance is obtained if stress liners are used since more topography is generated and the stress liners get very close to the device channel area and a solid HK/MG first encapsulation is provided, representing a solid and major yield enabler.

With regard to some aspects of the present disclosure, it was observed that the continued scaling towards 20/40 nm VLSI CMOS technologies increases marginalities, variabilities and challenges in the manufacturing of advanced semiconductor devices. The continued scaling in poly pitches between neighboring devices results further in a decreased space, where several implants, stress memorization techniques, salicidation, dual stress liners and strain contacts have to be fitted. With the need of continuing Moore's Law, a tremendous effort is necessary to figure out ways to solve all the marginalities in each individual process step and to reduce the variability and marginalities for building a very robust process.

In several aspects of the present disclosure, a solution to problems is proposed which occur with a continuous poly pitch scaling in a cost efficient way. Modern integrated circuits use several poly pitches depending on the used device gate length. The formation of multiple spacers for one device results in a reduced space for implanting, forming silicide regions and contact elements, in which the poly pitch is decreased. In order to prevent any filling voids and contact shortcuts, the spacers are removed to make space for the contact isolation layer and the contact elements. Currently, the spacers are removed in accordance with conventional techniques after the silicide formation processes by using a dry etch step. However, the dry etch attacks the silicide surface and increases the serial resistance and degrades device performance.

In some aspects of the present disclosure, it is, therefore, proposed to create a cost-efficient triangular silicide spacer which partially removes a silicide protection layer and a triangular silicide displacement holder. The triangular silicide spacer is created before salicidation takes place. Therefore, a late dry etching is omitted and no attacking of silicide material occurs, which would otherwise result in a degradation of the serial resistance and device performance.

In some illustrative embodiments of the present disclosure, a triangular silicide spacer is formed using a silicide protection layer for creating a spacer having a lower height prior to a salicidation process. The triangular silicide spacer is used as a displacement holder for the following salicidation process. As an effect, the strain introduction from a contact liner material into the channel region may be improved. Furthermore, a so-called spacer shaper etch or spacer removal etch after salicidation in accordance with conventional techniques, is obsolete. Consequently, silicide erosion is prevented and the contact resistance, as well as the serial resistance, is improved. Also, the yield is increased and a silicon/silicon-germanium cap, especially on narrow width devices, is protected from silicide erosion. Devices which are mainly used in standard cells have the benefit that the introduced strain remains and the performance improvement is preserved that would otherwise be taken away by silicide erosion in conventional devices. Furthermore, the proposed triangular spacer etch scheme as described above with regard to several illustrative embodiments of the present disclosure results in a better contact formation/landing less ILD voiding with less Tu subways, as well as better device performance and product performance.

The triangular silicide spacers may reliably embed and protect sensitive gate dielectric materials and work-function materials, such as hafnium oxide material and TiN material. Furthermore, additional strain may be imposed in close proximity to source/drain regions at the silicide contacts by the triangular silicide spacers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed is:

1. A method of forming a semiconductor device structure, comprising:
   providing source/drain regions within a semiconductor substrate adjacent a gate structure formed over said semiconductor substrate, said gate structure having a gate electrode structure, a first sidewall spacer and a second sidewall spacer, said first sidewall spacer covering sidewall surfaces of said gate electrode structure and said second sidewall spacer being formed on said first sidewall spacer, wherein said first sidewall spacer has an L-shape with a vertical leg and a horizontal leg;
removing said second sidewall spacer so as to expose said first sidewall spacer;
forming a third sidewall spacer on a portion of said first sidewall spacer such that said first sidewall spacer is partially exposed and said third sidewall spacer has a surface extending from said vertical leg to said source/drain regions; and
forming silicide regions in the presence of said third sidewall spacer in said source/drain regions.

2. The method of claim 1, wherein said third sidewall spacer is formed by depositing a sidewall spacer forming material over said semiconductor substrate and by etching said deposited sidewall spacer forming material with an etchant having a lateral etching component.

3. The method of claim 2, wherein said etching of said deposited sidewall spacer forming material uses said first sidewall spacer as an etch stop.

4. The method of claim 3, wherein said first sidewall spacer comprises silicon oxide material and said second and third sidewall spacers comprises silicon nitride material.

5. The method of claim 2, wherein said etching of said sidewall spacer forming material comprises an isotropic etching of said sidewall spacer forming material.

6. The method of claim 1, further comprising forming a doped region within said semiconductor substrate adjacent to said source/drain regions for further providing a diffusion resistor structure.

7. The method of claim 6, wherein forming said third sidewall spacer comprises:
depositing a sidewall spacer forming material over said gate structure and said diffusion resistor structure;
forming a masking pattern over said diffusion resistor structure; and
etching said deposited sidewall spacer forming material such that said third sidewall spacer is formed over said first sidewall spacer and two surface regions of said doped region remain uncovered.

8. The method of claim 7, wherein silicide resistor regions are formed in said two exposed regions of said doped region when forming said silicide regions in said source/drain regions.

9. The method of claim 1, further comprising:
providing a shallow trench isolation (STI) structure adjacent to at least one of the source/drain regions, wherein said STI structure has a dummy gate structure formed thereon; and
forming a fourth sidewall spacer on sidewalls of said dummy gate structure when forming said third sidewall spacer.

10. The method of claim 9, further comprising:
providing embedded stressor regions at opposing sides of said gate structure in said semiconductor material such that said STI structure borders at least one of said embedded stressor regions;
wherein said fourth sidewall spacer portion-wise covers said at least one of said embedded stressor regions bordering said STI structure.

11. The method of claim 10, wherein said embedded stressor regions are formed by embedding silicon/germanium (SiGe) material into said semiconductor material in alignment with said gate structure.

12. The method of claim 1, further comprising depositing an interlayer dielectric (ILD) liner over said semiconductor substrate after said silicide regions are formed.

13. The method of claim 12, wherein contact elements to said silicide regions are formed in said ILD liner in alignment with said third sidewall spacer.

14. The method of claim 12, wherein an etch stop liner is formed before said ILD liner is deposited, said ILD liner being deposited on said etch stop liner.

15. A method of forming a semiconductor device structure, comprising:
forming source/drain regions within a semiconductor substrate adjacent a gate structure formed over said semiconductor substrate, said gate structure having a gate electrode structure;
forming a first sidewall spacer and a second sidewall spacer, said first sidewall spacer covering sidewall surfaces of said gate electrode structure and said second sidewall spacer being formed on said first sidewall spacer, wherein said first sidewall spacer has an L-shape with a vertical leg and a horizontal leg;
removing said second sidewall spacer so as to expose said first sidewall spacer;
forming a third sidewall spacer on a portion of said first sidewall spacer such that said first sidewall spacer is partially exposed and said third sidewall spacer has a surface extending from said vertical leg to said source/drain regions, wherein forming the third sidewall spacer comprises:
depositing a sidewall spacer forming material over said semiconductor substrate; and
performing at least one etching process on said deposited sidewall spacer forming material wherein said first sidewall spacer is used as an etch stop during said at least one etching process performed on said deposited sidewall spacer forming material and wherein said at least one etching process comprises an isotropic etching process; and
forming silicide regions in the presence of said third sidewall spacer in said source/drain regions.

16. The method of claim 15, wherein said first sidewall spacer comprises silicon oxide material and said second and third sidewall spacers comprise silicon nitride material.

17. The method of claim 16, further comprising depositing an interlayer dielectric (ILD) liner over said semiconductor substrate after said silicide regions are formed.

18. The method of claim 17, wherein contact elements to said silicide regions are formed in said ILD liner in alignment with said third sidewall spacer.

19. The method of claim 15, further comprising:
forming an etch stop liner above the substrate after said silicide regions are formed; and
depositing an interlayer dielectric (ILD) liner over said semiconductor substrate and on and in contact with said etch stop liner.

20. A method of forming a semiconductor device structure, comprising:
forming source/drain regions within a semiconductor substrate adjacent a gate structure formed over said semiconductor substrate, said gate structure having a gate electrode structure;
forming a doped region within said semiconductor substrate for further providing a diffusion resistor structure;

forming a first sidewall spacer and a second sidewall spacer adjacent the gate structure, said first sidewall spacer covering sidewall surfaces of said gate electrode structure and said second sidewall spacer being formed on said first sidewall spacer, wherein said first sidewall spacer has an L-shape with a vertical leg and a horizontal leg;

removing said second sidewall spacer so as to expose said first sidewall spacer;

forming a third sidewall spacer on a portion of said first sidewall spacer such that said first sidewall spacer is partially exposed and said third sidewall spacer has a surface extending from said vertical leg to said source/drain regions, wherein forming the third sidewall spacer comprises:

depositing a sidewall spacer forming material over said semiconductor substrate; and performing at least one etching process on said deposited sidewall spacer forming material wherein said first sidewall spacer is used as an etch stop during said at least one etching process performed on said deposited sidewall spacer forming material and wherein said at least one etching process comprises an isotropic etching process; and forming silicide regions in the presence of said third sidewall spacer in said source/drain regions.

21. The method of claim 20, wherein performing said at least one etching process on said deposited sidewall spacer further results in the formation of a patterned portion of the deposited sidewall spacer forming material positioned adjacent the said doped region.

22. The method of claim 21, wherein when forming said silicide regions in said source/drain regions, a metal silicide region is also formed in portions of said doped region not covered by said patterned portion of the deposited sidewall spacer forming material.

23. The method of claim 22, further comprising depositing an interlayer dielectric (ILD) liner over said semiconductor substrate after all of said silicide regions are formed.

24. The method of claim 23, wherein contact elements to said silicide regions are formed in said ILD liner in alignment with said third sidewall spacer.

25. The method of claim 22, further comprising:

forming an etch stop liner above the substrate after said silicide regions are formed; and depositing an interlayer dielectric (ILD) liner over said semiconductor substrate and on and in contact with said etch stop liner.

* * * * *